US011996412B2

(12) United States Patent
Chen et al.

(10) Patent No.: US 11,996,412 B2

(45) Date of Patent: May 28, 2024

(54) SEMICONDUCTOR DEVICE AND METHOD OF FORMING SAME

(71) Applicant: Taiwan Semiconductor Manufacturing Co., Ltd., Hsinchu (TW)

(72) Inventors: Szu-Ying Chen, Hsinchu (TW); Sen-Hong Syue, Zhubei (TW); Li-Ting Wang, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/818,598

(22) Filed: Aug. 9, 2022

(65) Prior Publication Data

US 2022/0384436 A1 Dec. 1, 2022

Related U.S. Application Data

(62) Division of application No. 17/186,293, filed on Feb. 26, 2021, now Pat. No. 11,605,635.

(51) Int. Cl.

| | |
|---|---|
| ***H01L 29/94*** | (2006.01) |
| ***H01L 21/8234*** | (2006.01) |
| ***H01L 27/092*** | (2006.01) |
| ***H01L 29/06*** | (2006.01) |
| ***H01L 29/10*** | (2006.01) |
| ***H01L 29/66*** | (2006.01) |

(Continued)

(52) U.S. Cl.

CPC .. *H01L 27/0924* (2013.01); *H01L 21/823412* (2013.01); *H01L 21/823418* (2013.01); *H01L 21/823431* (2013.01); *H01L 21/82345* (2013.01); *H01L 21/823475* (2013.01); *H01L 21/823481* (2013.01); *H01L 29/0649* (2013.01); *H01L 29/1054* (2013.01); *H01L 29/66545* (2013.01); *H01L 29/66795* (2013.01); *H01L 29/7851* (2013.01)

(58) Field of Classification Search

CPC ......... H01L 27/0924; H01L 21/823412; H01L 21/823418; H01L 21/823431; H01L 21/82345; H01L 21/823475; H01L 21/823481; H01L 29/0649; H01L 29/1054; H01L 29/66545; H01L 29/66795; H01L 29/7851; H01L 21/823821; H01L 29/0673; H01L 29/1079; H01L 29/165; H01L 29/42392; H01L 29/66439; H01L 29/775; H01L 29/7843; H01L 29/7848; H01L 29/78696; H01L 21/823878; B82Y 10/00

USPC .......................................................... 257/288

See application file for complete search history.

(56) References Cited

U.S. PATENT DOCUMENTS

2016/0163700 A1* 6/2016 Peng .................... H01L 21/845 257/401

* cited by examiner

*Primary Examiner* — Theresa T Doan

(74) *Attorney, Agent, or Firm* — Slater Matsil, LLP

(57) ABSTRACT

In an embodiment, a method includes forming a plurality of fins adjacent to a substrate, the plurality of fins comprising a first fin, a second fin, and a third fin; forming a first insulation material adjacent to the plurality of fins; reducing a thickness of the first insulation material; after reducing the thickness of the first insulation material, forming a second insulation material adjacent to the first insulation material and the plurality of fins; and recessing the first insulation material and the second insulation material to form a first shallow trench isolation (STI) region.

20 Claims, 22 Drawing Sheets

64
62
56B
60
56A
55
52
52A 52B 52C 52C 52B 52A
54
52H
50

(51) Int. Cl.

| | |
|---|---|
| ***H01L 29/76*** | (2006.01) |
| ***H01L 29/78*** | (2006.01) |
| ***H01L 31/113*** | (2006.01) |

SEMICONDUCTOR DEVICE AND METHOD OF FORMING SAME

PRIORITY CLAIM AND CROSS-REFERENCE

This application is a divisional of U.S. patent application Ser. No. 17/186,293, filed on Feb. 26, 2021, entitled "Semiconductor Device and Method of Forming Same," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
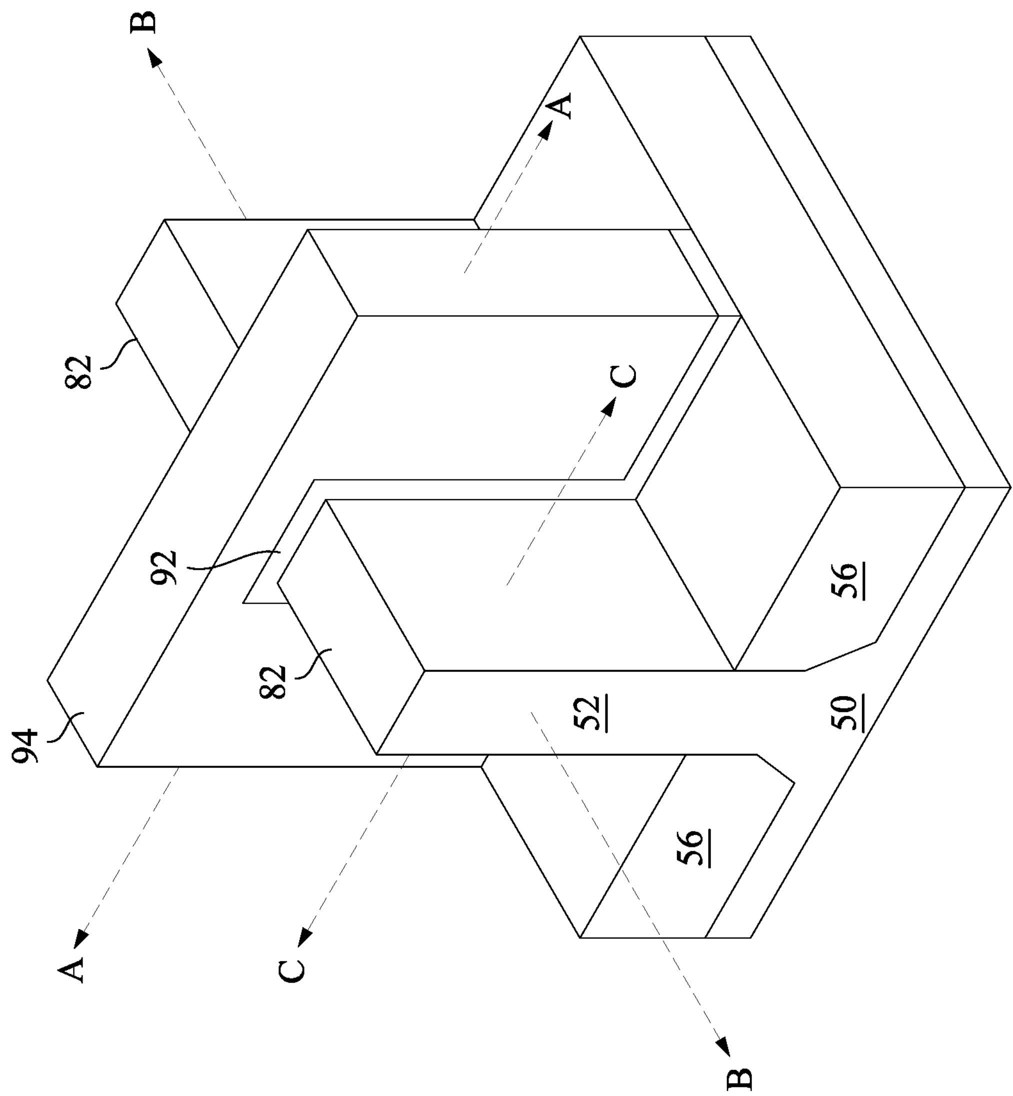
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming a die comprising fin field-effect transistors (FinFETs). The methods include forming semiconductor fins over a substrate and forming isolation regions between the semiconductor fins using a two-step deposition process. For example, the isolation regions may be formed by forming a first insulation material over and between the semiconductor fins, annealing the first insulation material, forming a second insulation material, and recessing the first and second insulation materials to expose the semiconductor fins. The annealing forms a strain, such as a compressive strain, in the first insulation material. The compressive strain is particularly located near boundaries between the semiconductor fins and the substrate and serves to reduce or prevent diffusion of dopants from the semiconductor fins to neighboring regions, such as the substrate. Gate structures may be formed over the first and second semiconductor fins to form transistor structures. Various embodiments may be applied, however, to dies comprising other types of transistors (e.g., nano-structure or nano-wire field-effect transistors (nanoFETs), planar transistors, or the like) in lieu of or in combination with the FinFETs. In addition, the FinFETs and/or other types of transistors may in a particular region may combine to form a logic gate, such as a not-and (NAND) gate or a not-or (NOR) gate.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 19B are cross-sectional views of intermediate stages in the manufacturing of FinFETs, in accordance with some embodiments. FIGS. 2 through 10 illustrate reference cross-section A-A illustrated in FIG. 1, except for multiple fins/FinFETs. FIGS. 11A, 12A, 13A, 14A, 15A, 16A, 17A, 18A, and 19A are illustrated along reference cross-section A-A illustrated in FIG. 1, and FIGS. 11B, 12B, 13B, 14B, 15B, 16B, 17B, 17C, 18B, and 19B are illustrated along a similar cross-section B-B illustrated in FIG. 1, except for multiple fins/FinFETs. FIGS. 13C and 13D are illustrated along reference cross-section C-C illustrated in FIG. 1, except for multiple fins/FinFETs.

Figure 2:
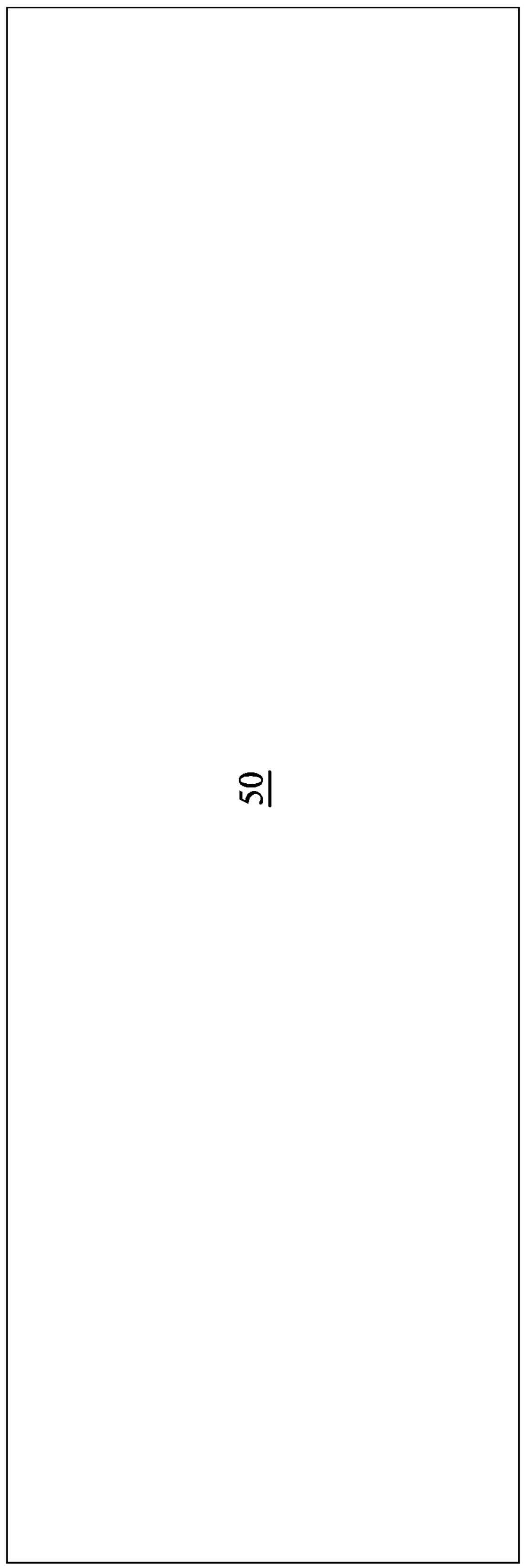
FIGS. 2, 3, 4, 5, 6, 7, 8, 9, 10, 11A, 11B, 12A, 12B, 13A, 13B, 13C, 13D, 14A, 14B, 15A, 15B, 16A, 16B, 17A, 17B, 17C, 18A, 18B, 19A, and 19B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

Figure 3:
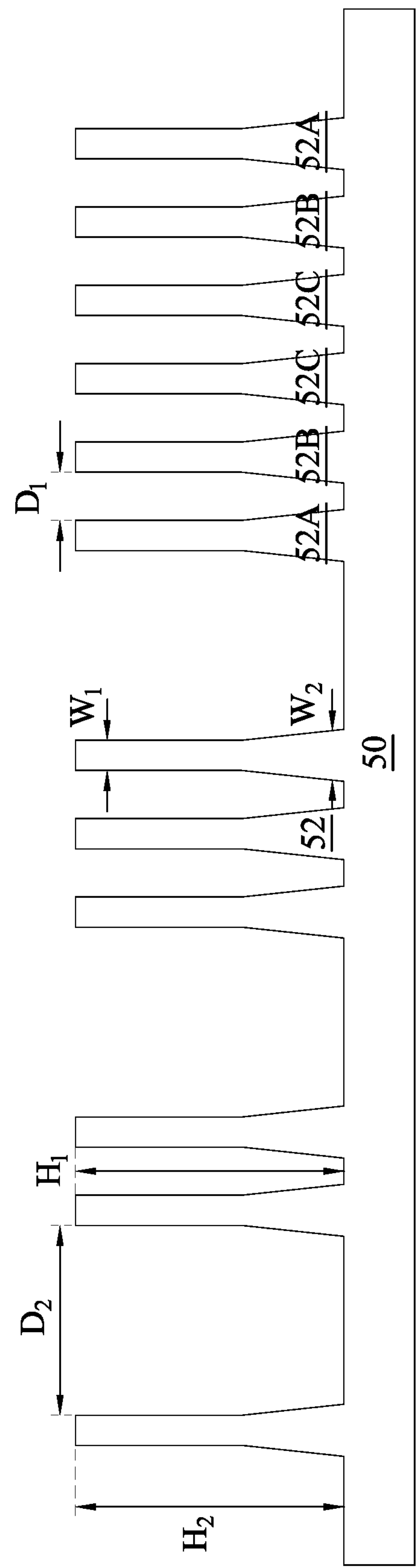

In FIG. 3, fins 52 are formed over the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. In other embodiments and discussed in greater detail below, a mask (not shown) may be formed and patterned over the substrate 50, and the fins 52 may be epitaxially grown over the substrate 50.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 52. In some embodiments, the mask (or other layer) may remain on the fins 52.

Still referring to FIG. 3, some of the fins 52 may be formed in groups or clusters in which some of the fins 52 are proximal to one another, while others of the fins 52 may be formed to have a greater lateral displacement from adjacent fins 52. For example, the clusters may comprise two or more of the fins 52, which may include a first fin 52A, a second fin 52B, and a third fin 52C. The first fin 52A is an outermost fin of a cluster, the second fin 52B is the second fin inward, and the third fin 52C is one of the inner fins. Each of the fins 52 within the cluster may be laterally displaced from one another by a distance $D_1$ of between about 15 nm and about 25 nm. The fins (e.g., an individual fin 52 and/or a first fin 52A) may be laterally displaced from other fins 52 or other clusters by a distance $D_2$ of between about 50 nm and about 150 nm. In some embodiments, due to differences in etching to form the various fins 52, the fins 52 within a cluster (e.g., the second fin 52B and the third fin 52C) may have a height $H_1$ from the substrate 50 that is the same or less than a height $H_2$ from the substrate 50 of the individual fins 52 or the first fins 52A in a cluster. Within the clusters, the height $H_1$ of the fins 52 (e.g., the second fins 52B and the third fins 52C) from the substrate 50 may be between about 40 nm and about 80 nm. In addition, the height $H_2$ from the substrate 50 of the other fins 52 (e.g., individual fins 52 and/or the first fins 52A) may be between about 100 nm and about 150 nm.

The process described with respect to FIGS. 2 through 3 is just one example of how the fins 52 may be formed. For example, it may be advantageous to epitaxially grow a material in an n-type region (e.g., an NMOS region) different from the material in a p-type region (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Figure 4:
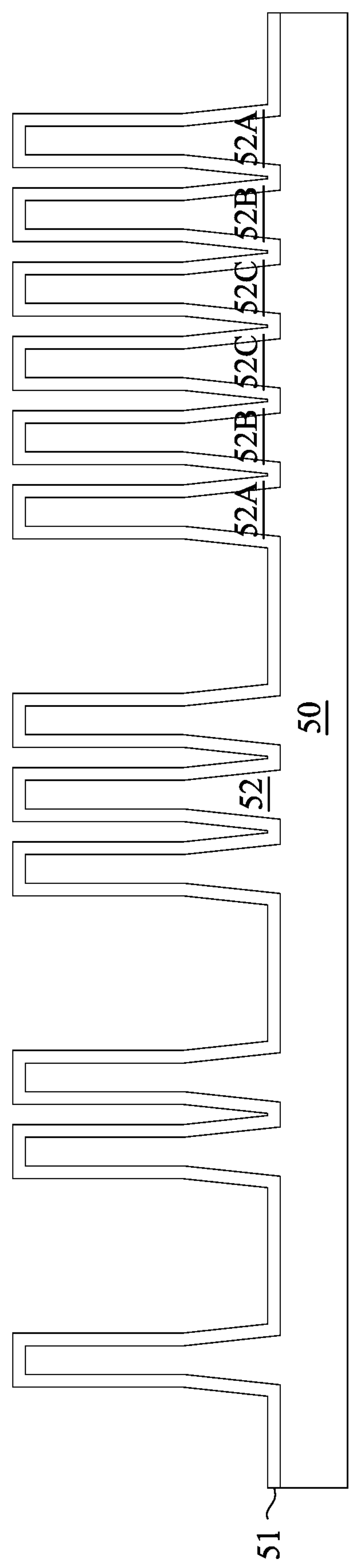

In FIG. 4, optionally, a liner layer 51 may be formed over and between neighboring fins 52. The liner layer 51 is a stable liner that provides protection to the fins 52 during subsequent steps, such as during formation of isolation regions (discussed and illustrated in later steps). In some embodiments, the liner layer 51 comprises a semiconductor material, such as silicon (Si), silicon carbon (SiC), silicon germanium (SiGe), or the like. The liner layer 51 may be formed by chemical vapor deposition (CVD), atomic layer deposition (ALD), epitaxial growth, vapor phase epitaxy (VPE), molecular beam epitaxy (MBE), or the like. In other embodiments, the liner layer 51 comprises a dielectric material, such as silicon oxide, silicon nitride, silicon oxynitride, or the like. The liner layer 51 may be deposited at a thickness of between about 20 Å to about 70 Å.

Figure 5:
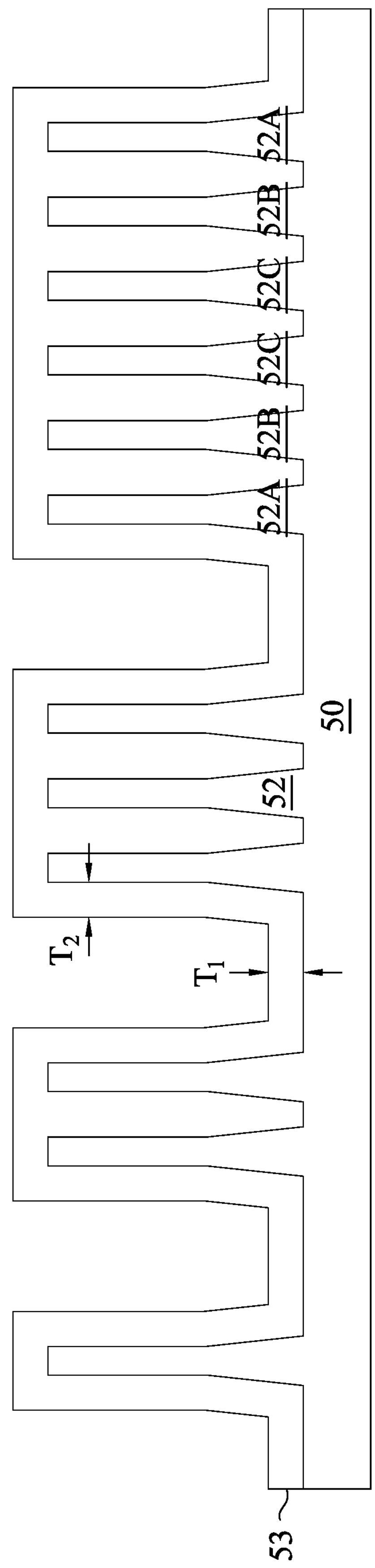

In FIG. 5, a first insulation material 53 is formed over the substrate 50, and the liner layer 51 is converted to a nitride and/or oxide (or further nitridized and/or oxidized the liner layer 51) to become part of the first insulation material 53. The first insulation material 53 will provide a stable dielectric layer over the fins 52 that will be subsequently treated to apply a compressive stress over the fins 52. As illustrated, formation of the first insulation material 53 may consume an entirety of the liner layer 51. For example, formation of the first insulation material 53 may oxidize or nitridize (or further oxidize or nitridize) the liner layer 51. The first insulation material 53 may comprise silicon oxide (SiO), silicon nitride (SiN), silicon oxynitride (SiON), silicon oxycarbide (SiOC), silicon carbonitride (SiCN), silicon oxycarbonitride (SiOCN), or the like.

The first insulation material 53 may be formed by chemical vapor deposition (CVD), high density chemical vapor deposition (HDP-CVD), atomic layer deposition (ALD), Flowable CVD, or any suitable process. For example, the first insulation material 53 may be formed by flowing silicon, oxygen, nitrogen, and/or carbon precursors to convert the liner layer 51 or thermally grow the first insulation material 53 from the liner layer 51. The precursors may comprise alkyl silanes, including tetraethoxysilane (TEOS), silane ($SiH_4$), and/or dichlorosilane ($H_2SiCl_2$), ozone ($O_3$), oxygen, water, nitrous oxide ($N_2O$), ammonia ($NH_3$), nitrogen, methylsilane ($CSiH_6$), trisilane amine (TSA), the like, and any combinations thereof.

In other embodiments not specifically illustrated, the first insulation material 53 may be deposited without converting an entirety of the liner layer 51 to become part of the first insulation material 53. As such, some or all of the liner layer 51 may remain over the fins 52 and the substrate 50. During the deposition process, oxygen may diffuse to oxidize (or further oxidize) the liner layer 51. The oxidation may continue in subsequent steps discussed below, such as steps including water and/or oxygen that are conducted at elevated temperatures. Despite the oxygen diffusion, the liner layer 51 may remain a distinct layer from the first insulation material 53.

In yet other embodiments in which the liner layer 51 is not formed before the first insulation material 53, the first insulation material 53 may be formed directly on the fins 52 and the substrate 50. The first insulation material 53 may be formed, for example, by conformally depositing the material over the fins 52 and the substrate 50 using any of the processes and precursors described above or any other suitable process or variation of the above-described processes.

The first insulation material 53 may be formed to have a thickness of between about 15 nm and about 40 nm. For example, a portion of the first insulation material 53 proximal to the substrate may have a thickness $T_1$ of between about 15 nm and about 50 nm, and a portion of the first insulation material 53 along outer sidewalls of the fins 52 (or clusters of the fins 52) may have a thickness $T_2$ of between about 20 nm and about 50 nm.

Figure 6:
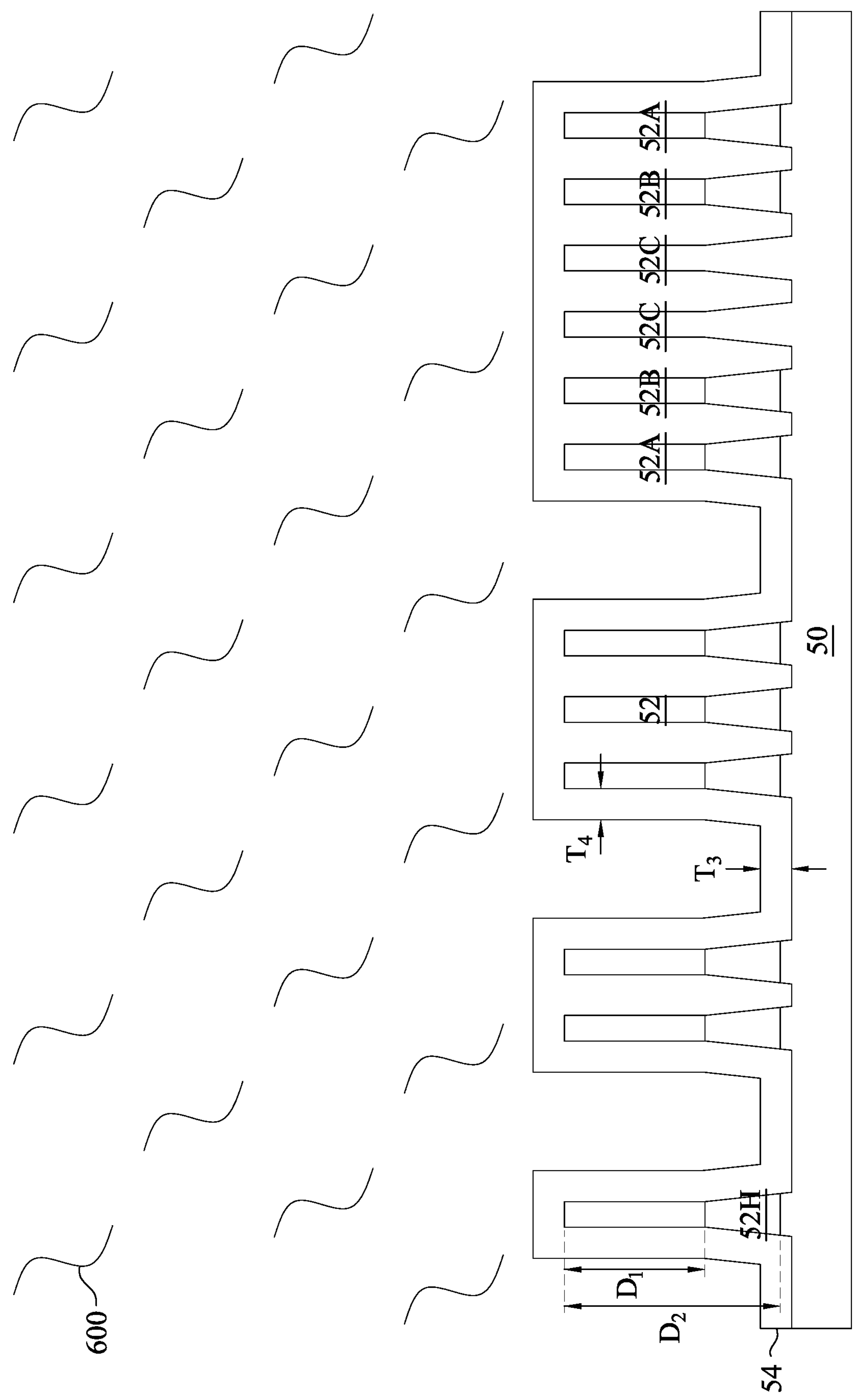

In FIG. 6, an anneal process 600 is performed to convert the first insulation material 53 into a second insulation material 54. In some embodiments, the anneal process 600 may yield the second insulation material 54 to have a different composition than the composition of the first insulation material 53. For example, the second insulation material 54 may be formed by oxidizing or further oxidizing the first insulation material 53. The anneal process 600 may be performed in an oxidizing ambient, such as with steam ($H_2O$) and/or oxygen ($O_2$). The anneal process 600 may further include other gases, such as nitrogen ($N_2$), argon (Ar), any combinations thereof, or the like. The anneal process 600 may be performed at a temperature of between about 300° C. and about 700° C. and for a duration of between about 30 minutes and about 480 minutes.

As stated above, in embodiments in which the anneal process 600 comprises an oxidizing anneal (e.g., a steam anneal), the composition of the second insulation material 54 may differ from the composition of the first insulation material 53. For example, any of the above-listed compositions may be converted into mostly silicon oxide. In an embodiment, when the first insulation material 53 is deposited as silicon oxide ($SiO_x$), x of the first insulation material 53 may be between about 1 and about 1.5 before the anneal process. After the anneal process 600, the second insulation material 54 may remain a silicon oxide ($SiO_x$). As such, x may be between about 1.5 and 2.

Alternatively, when the first insulation material 53 is deposited as silicon nitride ($SiN_y$), y may be between about 1.5 and about 2.5 before the anneal process 600. After the anneal process 600, the second insulation material 54 may become a silicon oxynitride ($SiO_xN_y$) or mostly a silicon oxide ($SiO_x$). As such, y may be between about 0 and about 0.5, and x may be between about 1 and about 2.

In other embodiments, when the first insulation material 53 is deposited as silicon oxynitride ($SiO_xN_y$), x may be between about 1 and about 2 and y may be between about 0.5 and about 1 before the anneal process 600. After the anneal process 600, the second insulation material 54 may remain a silicon oxynitride ($SiO_xN_y$) or become mostly a silicon oxide ($SiO_x$). As such, x may be between about 1.5 and about 2 and y may be between about 0 and about 0.2.

In embodiments in which the first insulation material 53 is deposited as silicon oxycarbide ($SiO_xC_z$), x may be between about 1 and about 1.5 and z may be between about 0 and about 0.5 before the anneal process 600. After the anneal process 600, the second insulation material 54 may remain a silicon oxycarbide ($SiO_xC_z$) or become mostly a silicon oxide ($SiO_x$). As such, x may be between about 1.5 and about 2 and z may be between about 0 and about 0.2.

A benefit of performing the anneal process 600 on the first insulation material 53 and before forming overlying layers is that the anneal process 600 may change thicknesses in portions of the first insulation material 53 during conversion to the second insulation material 54. The reduction in thicknesses (e.g., shrinkage) causes some of the compressive stress formed in the second insulation material 54 that applies against the fins 52. For example, after the anneal process 600, the portion of the second insulation material 54 proximal to the substrate may have a thickness $T_3$ of between about 15 nm and about 40 nm, and the portion of the second insulation material 54 along outer sidewalls of the fins 52 (or clusters of the fins 52) may have a thickness $T_4$ of between about 20 nm and about 40 nm. In particular, portions of the first insulation material 53 may undergo shrinkage during conversion to the second insulation material 54 such that the thickness $T_3$ is between about 5% and about 20% less than (or between about 80% and about 95% of) the thickness $T_1$, and the thickness $T_4$ is between about 5% and about 20% less than (or between about 80% and about 95% of) the thickness $T_2$.

As discussed above, the shrinkage caused by the anneal process 600 results in the second insulation material 54 applying a stress on the fins 52, such as a compressive stress, thereby forming a high strain region 52H in a lower portion of the fins 52. The high strain region 52H serves to prevent or reduce dopant diffusion from and between the substrate 50 and the fins 52 during further processing (e.g., from other anneal processes) and eventual functional use of the completed device (e.g., by leakage current). In particular, compressive strain generated in the (001) axis of the fins 52 achieves these benefits. The high stress region 52H may be located at an upper depth $D_1$ to a lower depth $D_2$ from top surfaces of the fins 52 of between about 80 nm to about 140 nm, respectively. In some embodiments, the depth $D_2$ may be near or at a boundary between the fin 52 and the substrate 50. As illustrated, a result of the compressive stress from the second insulation material 54 includes strain in at least individual fins 52 and the first fins 52A in a cluster because a greater portion of the second insulation material 54 extends adjacent to apply stress over the high strain regions 52H of those fins 52. At the depths $D_1$ to $D_2$ the strain of the high strain region 52H may be between about −0.3% and about −1.3% (e.g., a greater compressive strain) as compared to an upper bulk region of the fins 52.

Moving inward into a cluster of the fins 52, the strain in the fins 52 (e.g., the second fins 52B) from the second insulation material 54 may be less than in the individual fins 52 and the first fins 52A discussed above. The strain in the second fins 52B at the depths $D_1$ to $D_2$ in the high strain region 52H may be between about −0.3% and about −0.6% (e.g., a greater compressive strain) as compared to the upper bulk region of the second fins 52B and, therefore, by a lesser degree than the first fins 52A.

Moving further inward into a cluster of the fins 52, there may be no strain (or very low strain) in the third fins 52C from the second insulation material 54. Any strain in the third fins 52C at the depths $D_1$ to $D_2$ may be about the same as in the upper bulk region of the third fins 52C and, therefore, less than in the high strain regions 52H of the individual fins 52, the first fins 52A, and the second fins 52B. However, any suitable strain may be applied to the third fins 52C using alternative strain inducing methods.

Figure 7:
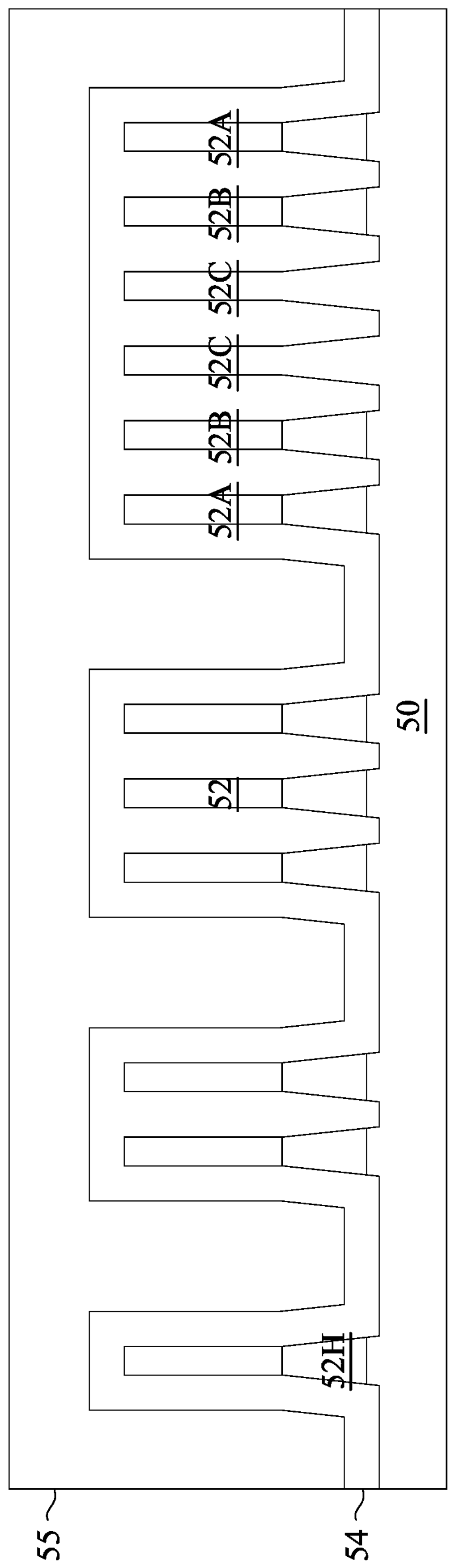

In FIG. 7, a third insulation material 55 is formed over the second insulation material 54 and between some of the fins 52. The third insulation material 55 may be an oxide, such as silicon oxide, a nitride, such as silicon nitride, the like, or a combination thereof. The third insulation material 55 may be the same composition as or a different composition than (e.g., comprising different elements or the same elements at varying proportions) the second insulation material 54. The third insulation material 55 may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the third insulation material 55 is silicon oxide formed by a FCVD process. In some embodiments, an anneal process may be performed once the third insulation material is formed. In an embodiment, the third insulation material 55 is formed such that excess third insulation material 55 covers the fins 52 and the second insulation material 54.

Figure 8:
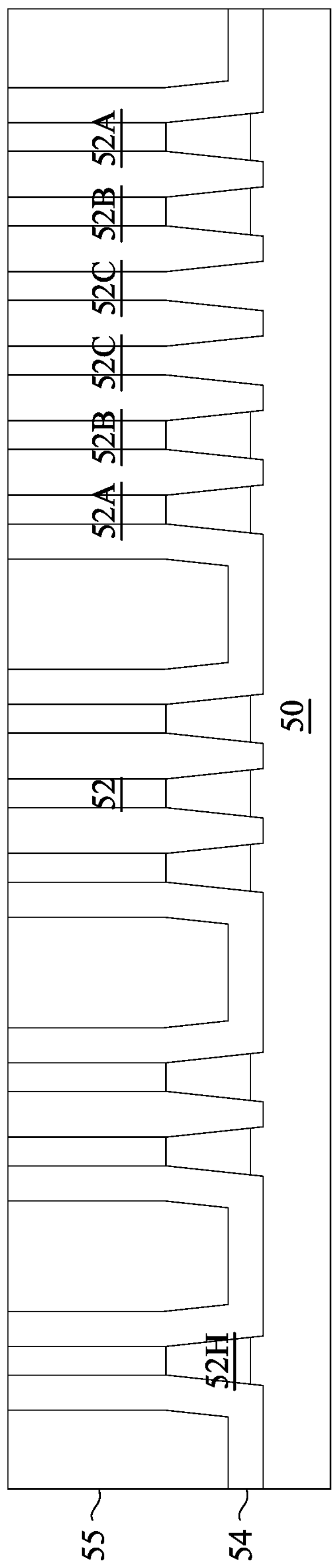

In FIG. 8, a removal process is applied to the second insulation material 54 and the third insulation material 55 to remove the excess from over the fins 52. In some embodiments, a planarization process such as a chemical mechanical polish (CMP), an etch-back process, combinations thereof, or the like may be utilized. The planarization process exposes the fins 52 such that top surfaces of the fins 52, the second insulation material 54, and the third insulation material 55 are level after the planarization process is complete. In embodiments in which a mask remains on the fins 52, the planarization process may expose the mask or remove the mask such that top surfaces of the mask or the fins 52, respectively, the second insulation material 54, and the third insulation material 55 are level after the planarization process is complete.

Figure 9:
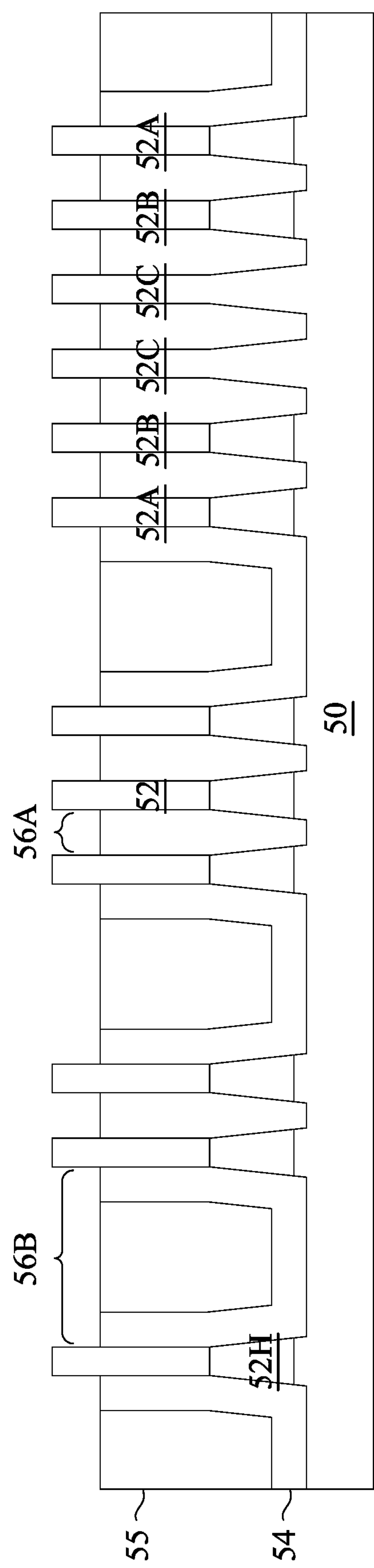

In FIG. 9, the second insulation material 54 and the third insulation material 55 are recessed to form Shallow Trench Isolation (STI) regions 56. The second insulation material 54 and the third insulation material 55 are recessed such that upper portions of the fins 52 protrude from between neighboring STI regions 56. Further, each of the top surfaces of the STI regions 56 may have a flat surface as illustrated, a convex surface, a concave surface (such as dishing), and/or a combination thereof. The top surfaces of the STI regions 56 may be formed flat, convex, and/or concave by an appropriate etch. The STI regions 56 may be recessed using an acceptable etching process, such as one that is selective to the materials of the second insulation material 54 and the third insulation material 55 (e.g., etches the material of the second insulation material 54 and the third insulation material 55 at faster rates than the material of the fins 52). For example, an oxide removal using, for example, dilute hydrofluoric (dHF) acid may be used.

By performing the embodiments described above, multiple types of STI regions 56, such as a first STI region 56A and a second STI region 56B, may be formed with different compositions. For example, regarding the first STI region 56A between the fins 52 within a same cluster (e.g., between the first fin 52A, the second fin 52B, and/or the third fin 52C), the first STI region 56A may comprise a single composition comprising the second insulation material (or a substantially single composition if some of the liner layer 51 remains). As such, the first STI region 56A comprises the second insulation material 54 (e.g., being free of the third insulation material 55) interposed between adjacent fins 52, wherein the second insulation material 54 comprises a bulk or all of the first STI region 56A.

In addition, regarding the second STI region 56B between individual fins 52 not in a cluster, between the first fin 52A of a cluster and a first fin 52A of another cluster, or between an individual fin 52 and a first fin 52A of a cluster, the second STI region 56B may comprise a mixed composition comprising the second insulation material 54 and the third insulation material 55 (as well as the liner layer 51 if some of it remains). As such, the second STI region 56B comprises both the second insulation material 54 and the third insulation material 55 interposed between adjacent fins 52, wherein the third insulation material 55 comprises a bulk of the second STI region 56B and the second insulation material 54 comprises a minority of the second STI region 56B.

Further in FIG. 9, appropriate wells (not shown) may be formed in the fins 52 and/or the substrate 50. In some embodiments, a P well may be formed in any n-type regions, and an N well may be formed in any p-type regions. In some embodiments, a P well or an N well are formed in both n-type and p-type regions. Alternatively, the wells may be formed after formation of the liner layer 51, which means the liner layer 51 (and the second insulation material 54) may comprise the dopant impurities described below. In either case, the strain formed in the second insulation material 54 serves to prevent or reduce these dopants from diffusing during subsequent processing and eventual use of the completed device.

In the embodiments with different well types, the different implant steps for the n-type regions and the p-type regions may be achieved using a photoresist and/or other masks (not shown). For example, a photoresist may be formed over the fins 52 and the STI regions 56 in the n-type region. The photoresist is patterned to expose the p-type region of the substrate 50. The photoresist can be formed by using a spin-on technique and can be patterned using acceptable photolithography techniques. Once the photoresist is patterned, an n-type impurity implant is performed in the p-type region, and the photoresist may act as a mask to substantially prevent n-type impurities from being implanted into the n-type region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the p-type region, a photoresist is formed over the fins 52 and the STI regions 56 in the p-type region. The photoresist is patterned to expose the n-type region of the substrate 50. The photoresist can be formed by using a spin-on technique and can be patterned using acceptable photolithography techniques. Once the photoresist is patterned, a p-type impurity implant may be performed in the n-type region, and the photoresist may act as a mask to substantially prevent p-type impurities from being implanted into the p-type region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the n-type region and the p-type region, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 10:
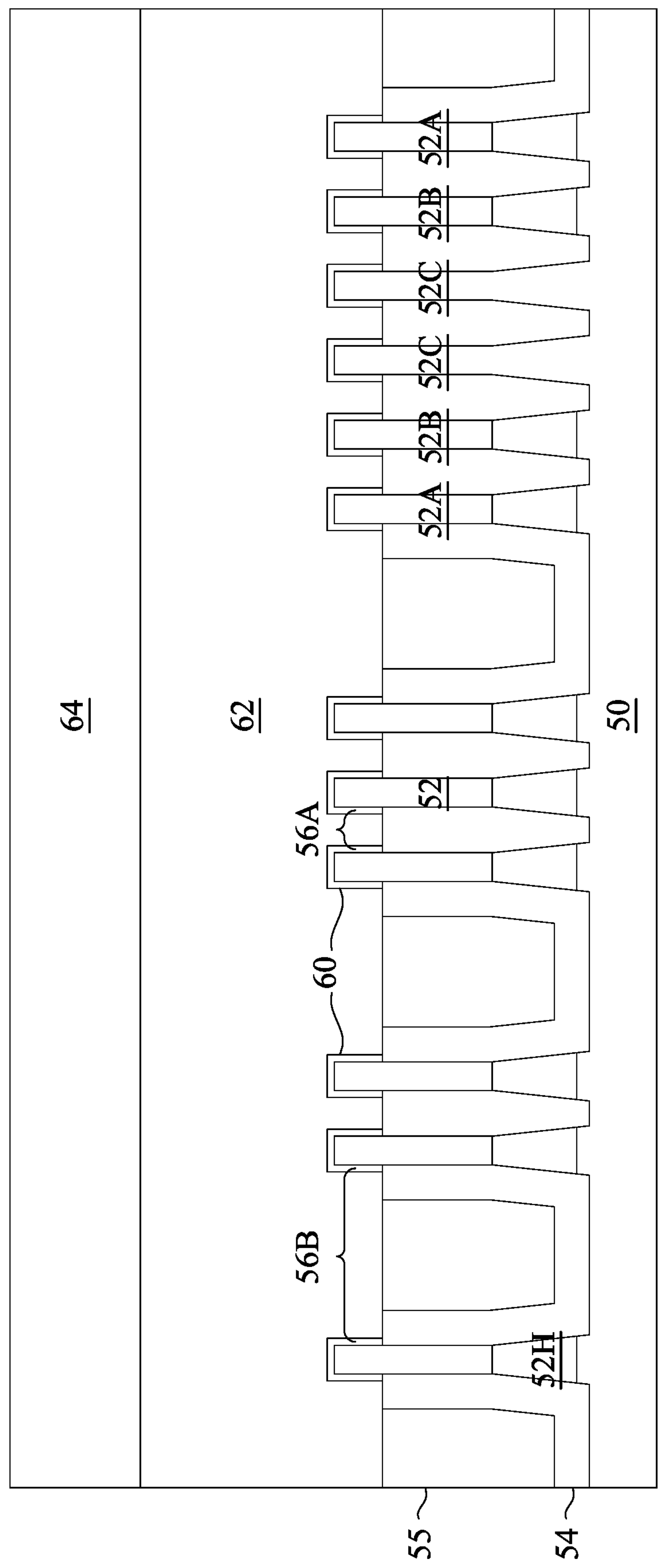

In FIG. 10, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type regions and the p-type regions. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions 56 and between the dummy gate layer 62 and the STI regions 56. For example, the dummy dielectric layer 60 may contact upper surfaces of the liner layer 51, the second insulation material 54, and/or the third insulation material 55.

FIGS. 11A through 19B illustrate various additional steps in the manufacturing of embodiment devices. For the sake of simplicity, FIGS. 11A through 19B illustrate features, including individual fins 52 spaced apart by the second STI regions 56B, in either of an n-type region and a p-type region. For example, the structures illustrated in FIGS. 11A through 19B may be applicable to both individual fins 52 (spaced apart by the second STI regions 56B) or clusters of the fins 52 (spaced apart by the first STI regions 56A and/or the second STI regions 56B). Differences (if any) in the structures of the n-type region and the p-type region are described in the text accompanying each figure.

Figure 11B:
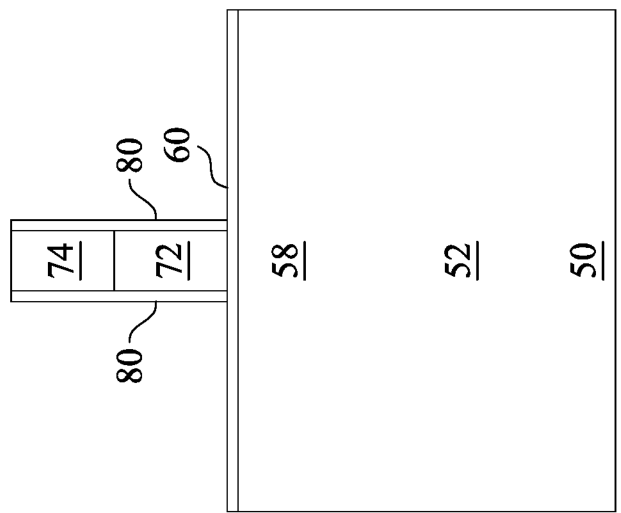
Figure 11A:
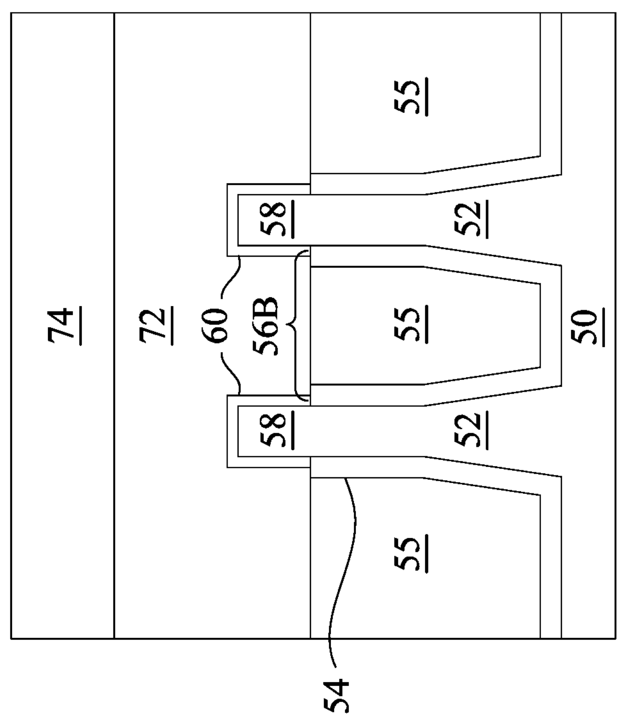

In FIGS. 11A and 11B, the mask layer 64 (see FIG. 10) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 11A and 11B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 9, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $cm^{-3}$ to about $10^{19}$ $cm^{-3}$. An anneal may be used to repair implant damage and to activate the implanted impurities.

Figure 12B:
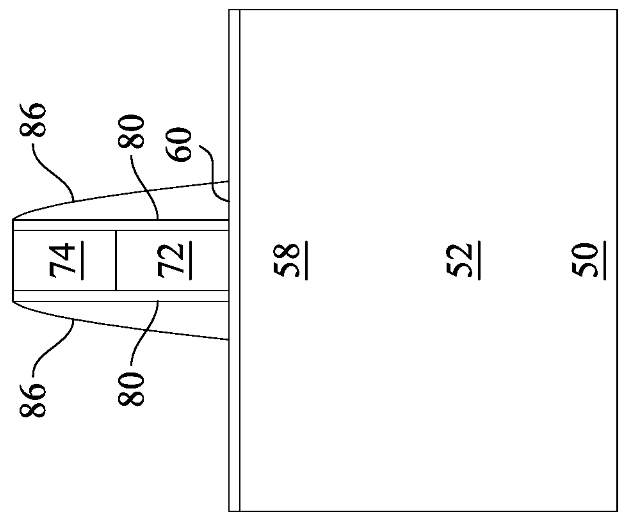
Figure 12A:
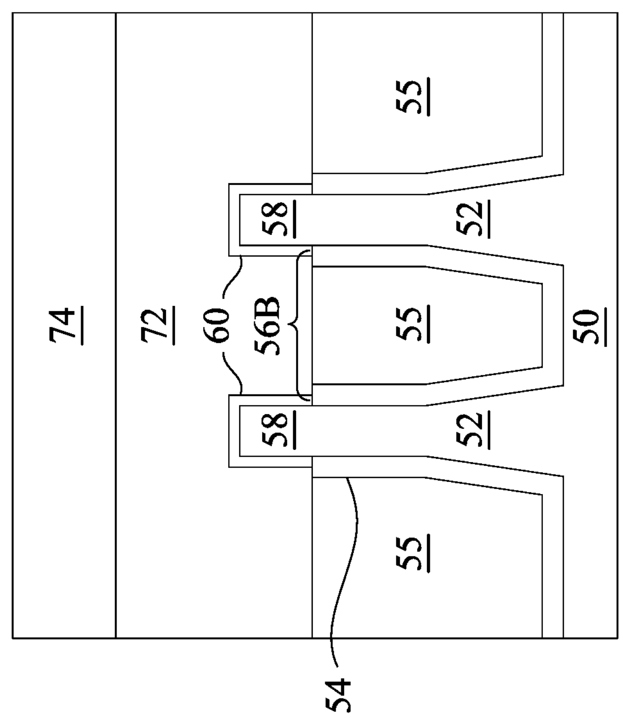

In FIGS. 12A and 12B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers), spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 13B:
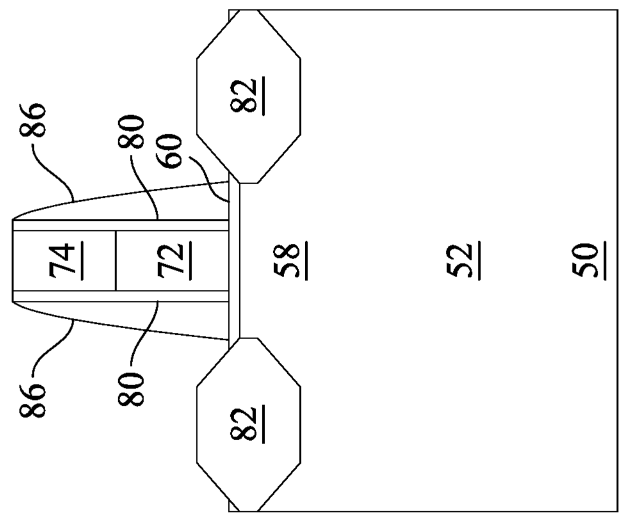
Figure 13A:
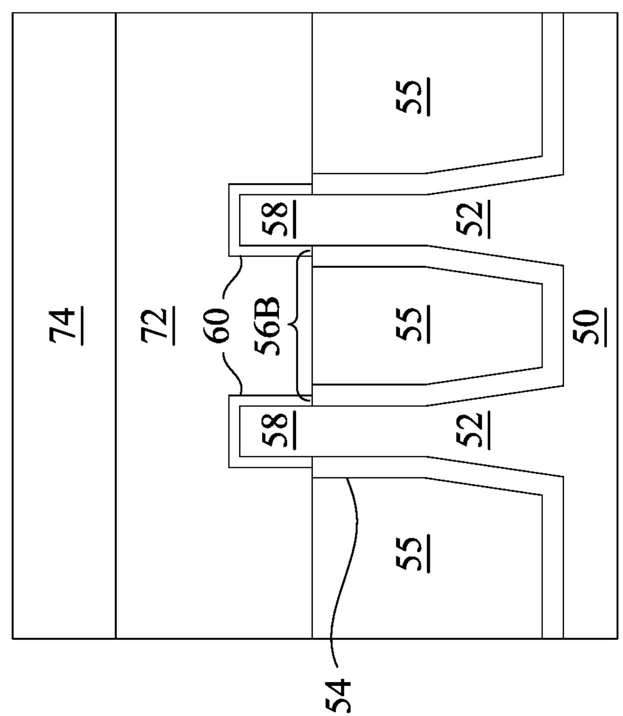
Figure 13D:
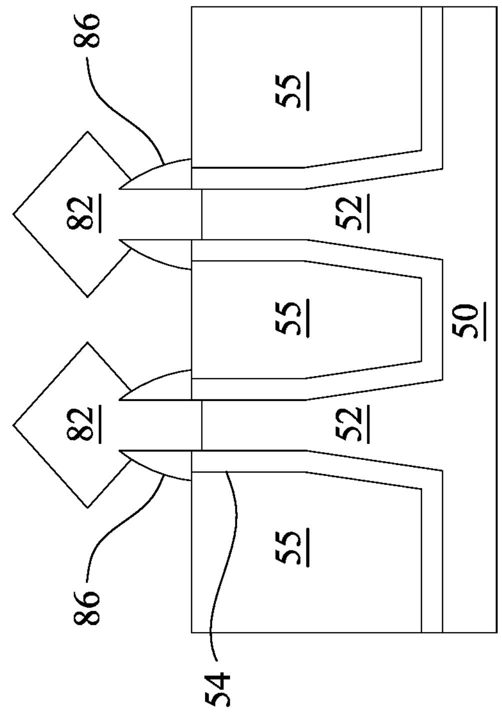
Figure 13C:
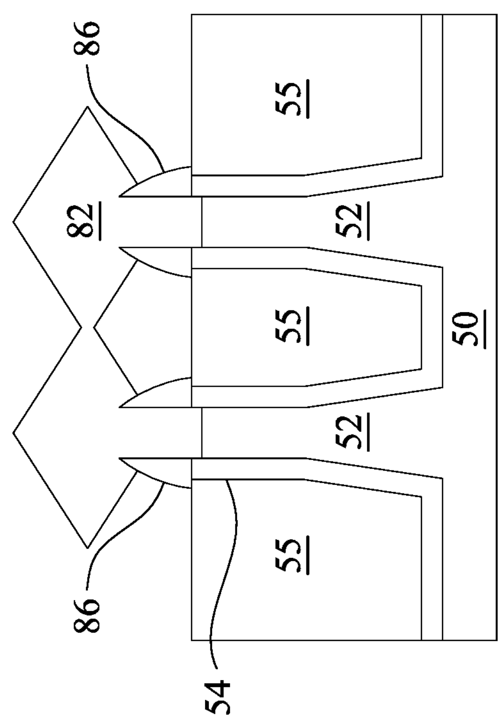

In FIGS. 13A and 13B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ $cm^{-3}$ and about $10^{21}$ $cm^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 13C. In other embodiments, adjacent source/drain regions 82 remain separated after the epitaxy process is completed as illustrated by FIG. 13D. In the embodiments illustrated in FIGS. 13C and 13D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 14B:
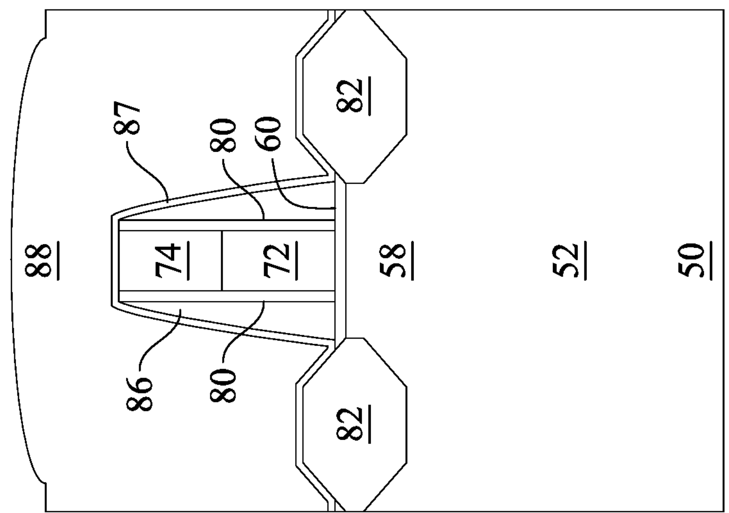
Figure 14A:
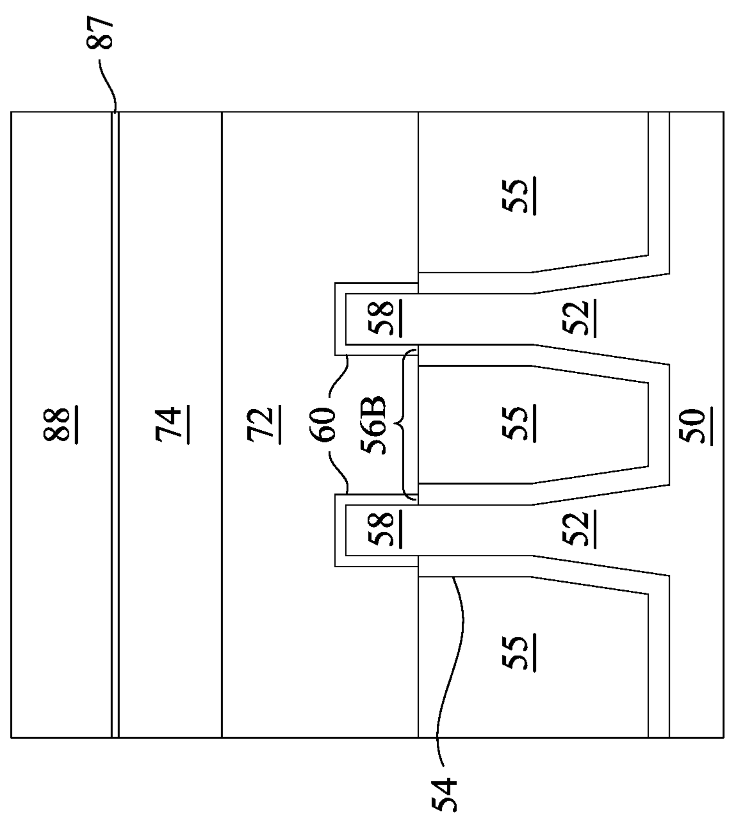

In FIGS. 14A and 14B, a first interlayer dielectric (ILD) 88 is deposited over the structure illustrated in FIGS. 13A and 13B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 15B:
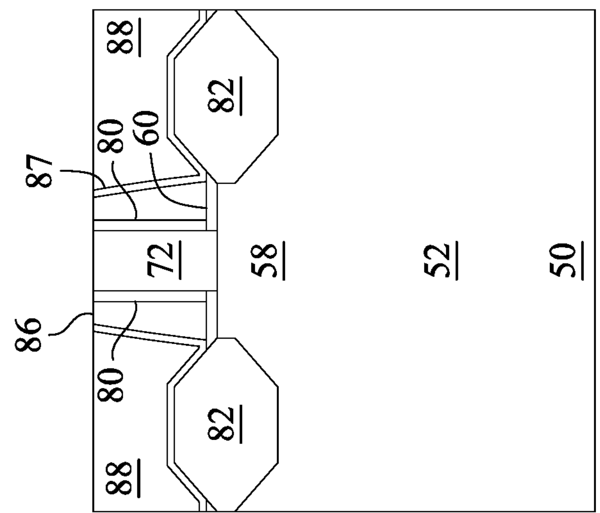
Figure 15A:
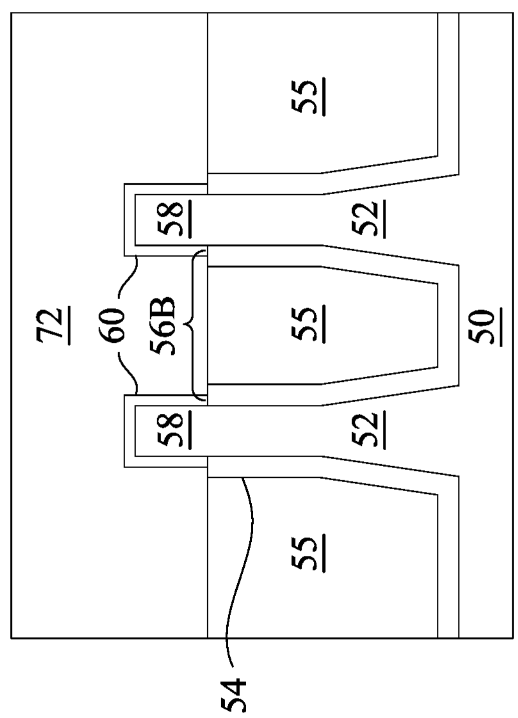

In FIGS. 15A and 15B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 16B:
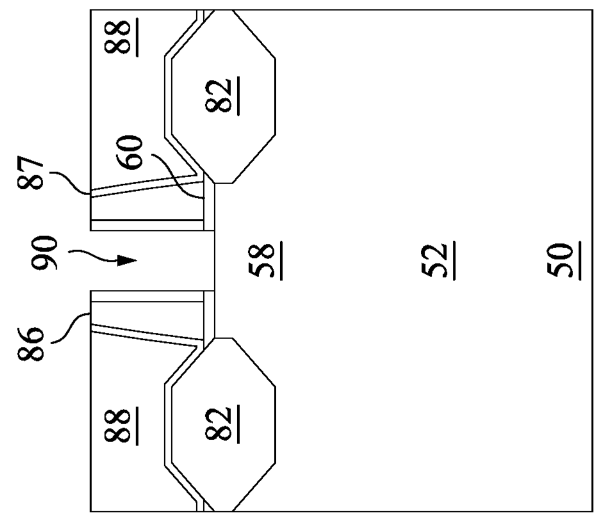
Figure 16A:
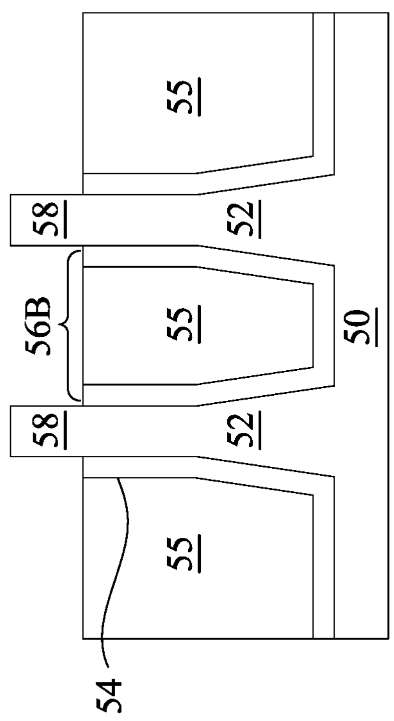

In FIGS. 16A and 16B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 17B:
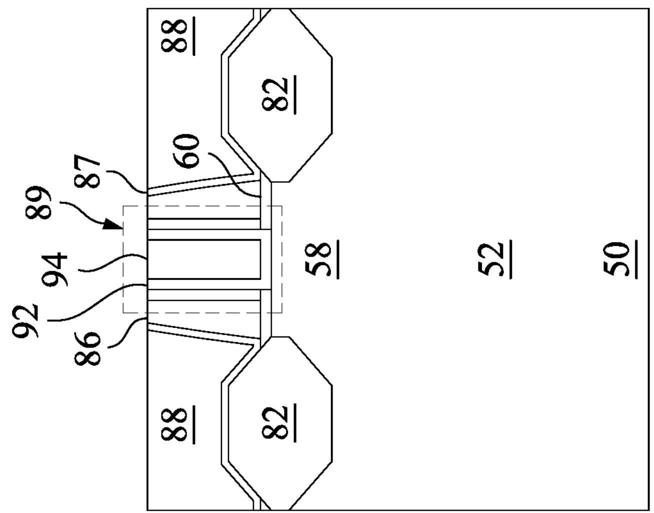
Figure 17A:
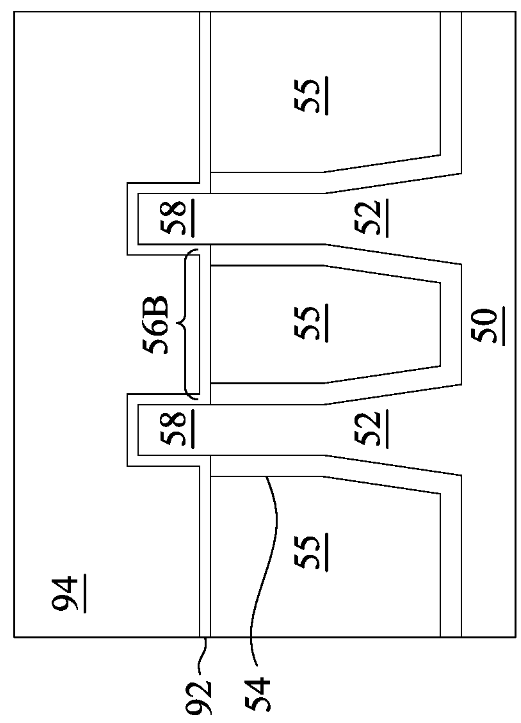
Figure 17C:
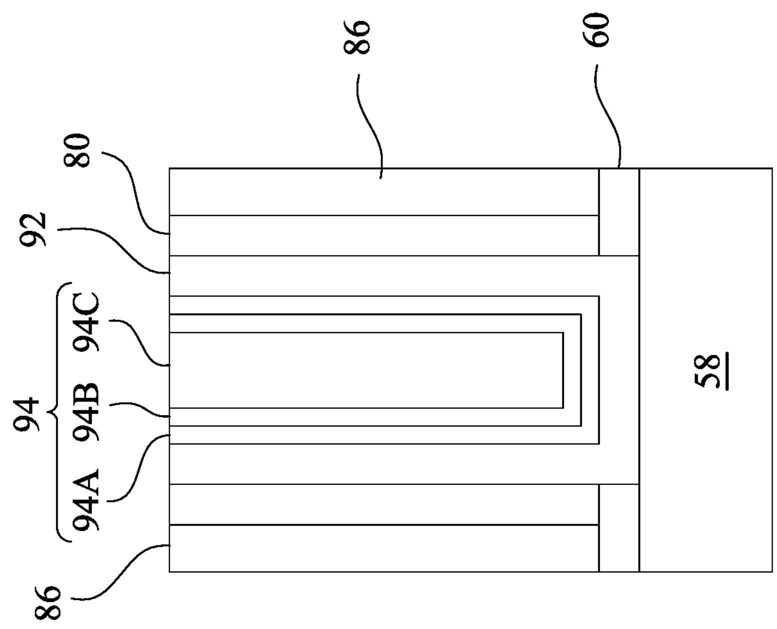

In FIGS. 17A and 17B, gate dielectric layers 92 and gate electrodes 94 are formed for replacement gates. FIG. 17C illustrates a detailed view of region 89 of FIG. 17B. Gate dielectric layers 92 one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 17B, the gate electrode 94 may comprise any number of liner layers 94A, any number of work function tuning layers 94B, and a fill material 94C as illustrated by FIG. 17C. After the filling of the recesses 90, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 18B:
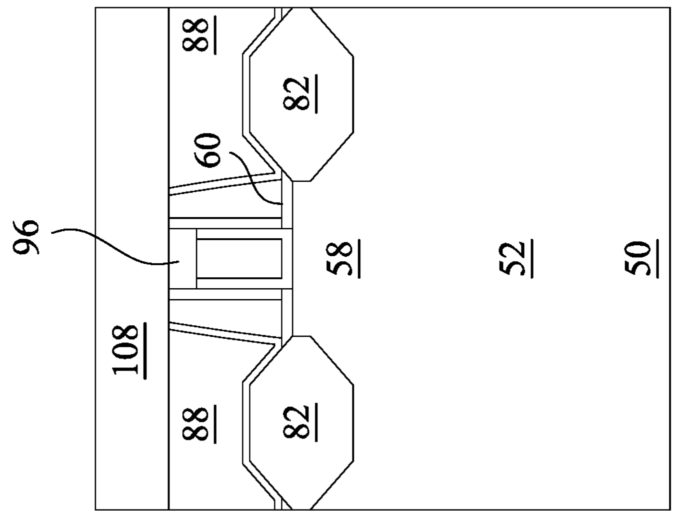
Figure 18A:
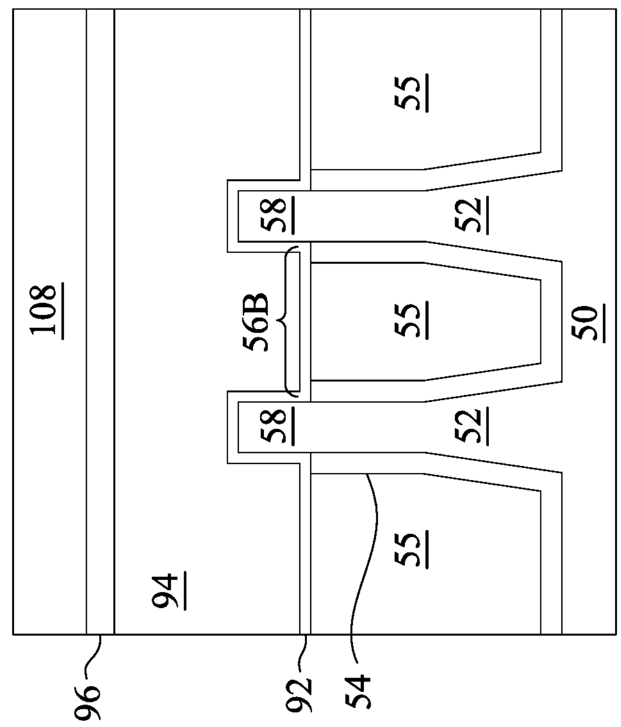

In FIGS. 18A and 18B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 18A and 18B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 19A and 19B) penetrate through the second ILD 108 and the gate mask 96 to contact the top surface of the recessed gate electrode 94.

Figure 19B:
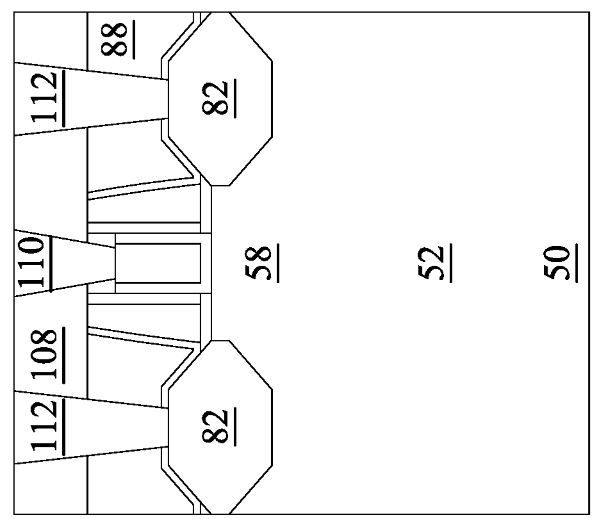
Figure 19A:
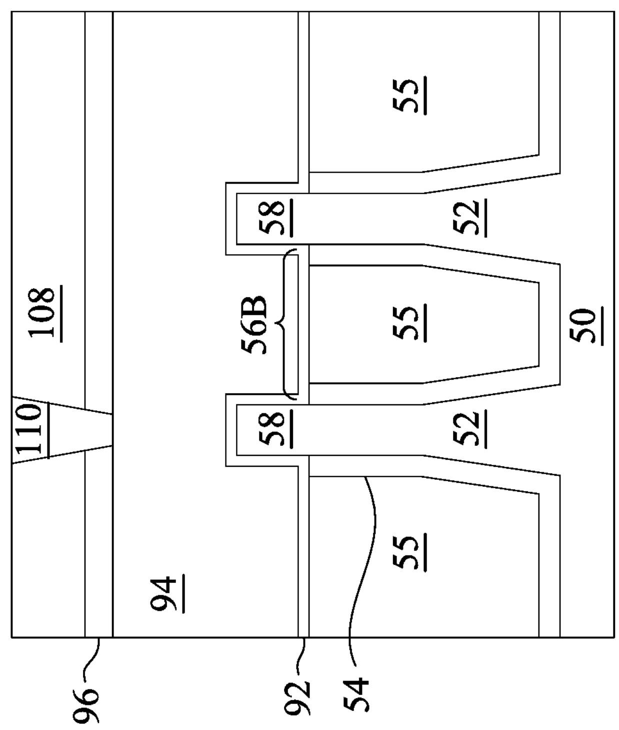

In FIGS. 19A and 19B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Figure 20:
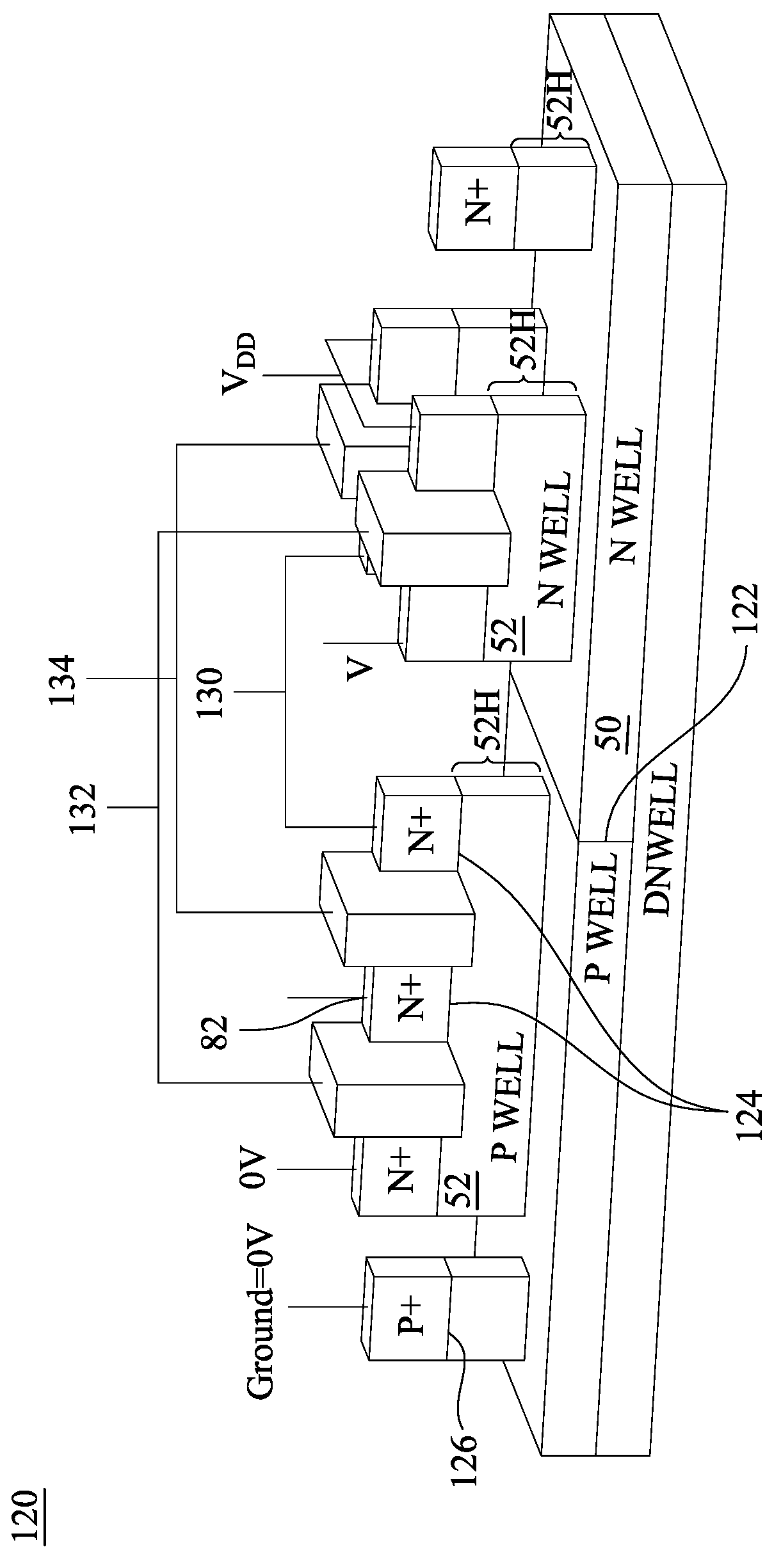
FIG. 20 illustrates an example of a not-and (NAND) logic gate in a three-dimensional view, in accordance with some embodiments.

FIG. 20 illustrates an example of a plurality of transistors (e.g., FinFETs) forming a logic gate 120 in a three-dimensional view, in accordance with some embodiments. The logic gate 201 is illustrated as a NAND gate, however, the disclosed embodiments may apply to other types of logic gates, such as a NOR gate. Note that the STI regions 56 are not illustrated in FIG. 20, and, instead, high strain regions 52H caused by the STI regions 56 (e.g., the second insulation material 54) are indicated in portions of the fins 52 proximal to the substrate 50.

During functional use of the logic gate 120, certain locations may experience leakage current. As discussed above, the high strain regions 52H in lower portions of the fins 52 (e.g., the individual fins 52 and the first fins 52A in a cluster) may have a strain that is about −0.3% to about −1.3% of the strain in upper portions of those fins 52, thereby preventing or reducing dopant diffusion between the fins 52 and the substrate 50 due to leakage current. In addition, the high strain regions 52H in lower portions of other fins 52 (e.g., the second fins 52B in a cluster) may have a strain that is about −0.3% to about −0.6% of the strain in upper portions of those fins 52, thereby also preventing or reducing dopant diffusion between the fins 52 and the substrate 50 due to leakage current. Further, lower portions of other fins 52 (e.g., the innermost fins 52 and/or the third fins 52C in a cluster) may have a strain that is about the same as the strain in upper portions of those fins 52, thereby providing comparably less protection against dopant diffusion due to leakage current.

As illustrated, a first leakage current 122 may tend to flow from an n-type conductivity region (e.g., an n-type well) to a p-type conductivity region (e.g., a p-type well). In addition, a second leakage current 124 may tend to flow from an n+-type conductivity region (e.g., an epitaxial source/drain region) to the p-type conductivity region in the underlying fin 52 and the substrate 50. Further, a third leakage current 126 may flow from the p-type conductivity region to a p+-type conductivity region (e.g., a ground voltage source). The leakage current may flow, for example, when a NAND output 130 is set to a high voltage and a first NAND input 132 and a second NAND input 134 are both set to a low voltage. Similar leakage current may flow in other types of logic gates 120, including NOR gates. In those embodiments, the compressive stress from the adjacent second insulation material 54 that forms a strain in the fins 52 will prevent or reduce dopant diffusion from the leakage current, for example, from the fins 52 into the substrate 50 or the substrate 50 into the fins 52.

The disclosed embodiments achieve advantages. The formation of the STI regions 56 includes a two-deposition process of forming the second insulation material 54 and the third insulation material 55. In particular, the anneal process 600 to form the second insulation material 54 (e.g., from the first insulation material 53) results in the second insulation material 54 applying a compressive stress to the adjacent fins 52. The compressive stress forms a high strain region 52H in lower portions of some of the fins 52 (e.g., the strain in the lower portion of those fins 52 may be between about −0.3% and about −1.3% of the strain in the upper portion of those fins 52). The high strain region 52H prevents or reduces dopant diffusion between the fins 52 and the substrate 50 during functional use of the completed semiconductor device. For example, dopant diffusion is reduced during settings and in locations of the functioning semiconductor device in which leakage current would tend to flow.

In an embodiment, a method includes forming a plurality of fins adjacent to a substrate, the plurality of fins comprising a first fin, a second fin, and a third fin; forming a first insulation material adjacent to the plurality of fins; reducing a thickness of the first insulation material; after reducing the thickness of the first insulation material, forming a second insulation material adjacent to the first insulation material and the plurality of fins; and recessing the first insulation material and the second insulation material to form a first shallow trench isolation (STI) region. In another embodiment, the method further includes, before forming the first insulation material, forming a liner layer adjacent to the plurality of fins. In another embodiment, forming the first insulation material comprises oxidizing the liner layer. In another embodiment, forming the first insulation material comprises conformally depositing the first insulation material. In another embodiment, reducing the thickness of the first insulation material modifies a first strain in the first fin at a first boundary between the first fin and the substrate. In another embodiment, the reducing the thickness of the first insulation material modifies a second strain in the second fin at a second boundary between the second fin and the substrate, the modifying the second strain being by a lesser degree than the modifying the first strain. In another embodiment, recessing the first insulation material and the second insulation material further comprises forming a second STI region, wherein the first STI region comprises the first insulation material and the second insulation material, and wherein the second STI region comprises the first insulation material and is free of the second insulation material. In another embodiment, reducing the thickness of the first insulation material comprises performing an anneal on the first insulation material.

In an embodiment, a method includes forming a first fin, a second fin, and a third fin adjacent to a substrate, the first fin and the second fin separated by a first opening, the second fin and the third fin separated by a second opening; depositing a first insulation material in the first opening and in the second opening, a first portion of the first insulation material in the first opening and proximal to the substrate having a first thickness, a second portion of the first insulation material in the first opening and along a sidewall of the second fin having a second thickness; annealing the first insulation material, wherein after the annealing the first insulation material: the first portion has a third thickness, the third thickness being less than the first thickness; and the second portion has a fourth thickness, the fourth thickness being less than the second thickness; forming a second insulation material adjacent to the first insulation material; recessing the first insulation material and the second insulation material to form a first isolation region and a second isolation region; and forming gate structures adjacent to the first fin, the second fin, and the third fin. In another embodiment, after the annealing the first insulation material, the first insulation material applies a first compressive stress on the first fin and a second compressive stress on the second fin. In another embodiment, the first compressive stress causes a greater strain in a lower portion of the first fin as compared to an upper portion of the first fin, the lower portion being more proximal than the upper portion to the substrate. In another embodiment, the third thickness is about 80-95% of the first thickness, and wherein the fourth thickness is about 80-95% of the second thickness. In another embodiment, after depositing the first insulation material, the first insulation material fills a portion of the first opening and an entirety of the second opening. In another embodiment, after depositing the second insulation material, the second insulation material fills a remainder of the first opening. In another embodiment, the method further includes, before depositing the first insulation material, forming a liner layer in the first opening and in the second opening. In another embodiment, during the depositing the first insulation material, the liner layer becomes nitridized. In another embodiment, before the annealing, the first insulation material comprises nitrogen, oxygen, and carbon.

In an embodiment, a device includes a first fin, a second fin, and a third fin disposed adjacent to a substrate, the first fin being laterally displaced from the second fin by a first isolation region and a first distance, the second fin being laterally displaced from the third fin by a second isolation region and a second distance, the first distance being greater than the second distance; a first insulation layer extending along a sidewall of the first fin, a first top surface of the substrate, and a first sidewall of the second fin, the first insulation layer comprising a minority of the first isolation region; a second insulation layer extending along a second sidewall of the second fin, a second top surface of the substrate, and a sidewall of the third fin, the second insulation layer comprising a bulk of the second isolation region; and a third insulation layer disposed adjacent to the first insulation layer, the third insulation layer being interposed between the first fin and the second fin, the third insulation layer comprising a bulk of the first isolation region. In another embodiment, the first fin comprises a first lower portion having a first lower compressive strain and a first upper portion having a first upper compressive strain, the first lower portion being more proximal than the first upper portion to the substrate, the first lower compressive strain being greater than the first upper compressive strain. In another embodiment, the third fin comprises a third lower portion having a third lower compressive strain and a third upper portion having a third upper compressive strain, the third lower portion being more proximal than the third upper portion to the substrate, the third lower compressive strain being greater than the third upper compressive strain, the third lower compressive strain being lesser than the first lower compressive strain.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

a first fin, a second fin, and a third fin disposed adjacent to a substrate, the first fin being laterally displaced from the second fin by a first isolation region and a first distance, the second fin being laterally displaced from the third fin by a second isolation region and a second distance, the first distance being greater than the second distance, the first fin comprising a first lower portion, the first lower portion comprising a first compressive strain;

a first insulation layer extending along a sidewall of the first fin, a first top surface of the substrate, and a first sidewall of the second fin, the first insulation layer comprising a minority of the first isolation region;

a second insulation layer extending along a second sidewall of the second fin, a second top surface of the substrate, and a sidewall of the third fin, the second insulation layer comprising a bulk of the second isolation region; and a third insulation layer disposed adjacent to the first insulation layer, the third insulation layer being interposed between the first fin and the second fin, the third insulation layer comprising a bulk of the first isolation region.

2. The device of claim 1, wherein the first fin comprises a first upper portion, wherein the first fin has a first strain difference between the first lower portion and the first upper portion, and wherein the first lower portion has a greater compressive strain than the first upper portion.

3. The device of claim 2, wherein the second fin comprises a second lower portion and a second upper portion, wherein the second fin has a second strain difference between the second lower portion and the second upper portion, and wherein the second lower portion has a greater compressive strain than the second upper portion.

4. The device of claim 3, wherein the third fin comprises a third lower portion and a third upper portion, wherein the third fin has a third strain difference between the third lower portion and the third upper portion, wherein the third lower portion has a greater compressive strain than the third upper portion, and wherein the third strain difference is less than the first strain difference and the second strain difference.

5. The device of claim 4, further comprising a fourth fin disposed adjacent to the third fin, wherein the third fin is interposed between the second fin and the fourth fin, and wherein the fourth fin is laterally displaced from the third fin by the second distance.

6. The device of claim 5, wherein the fourth fin comprises a fourth lower portion and a fourth upper portion, wherein the fourth fin has a fourth strain difference between the fourth lower portion and the fourth upper portion, and wherein the fourth strain difference is the same as the second strain difference.

7. The device of claim 4, further comprising a fifth fin disposed adjacent to the first fin, wherein the first fin is interposed between the fifth fin and the second fin, and wherein the fifth fin is laterally displaced from the first fin by the second distance.

8. The device of claim 7, wherein the fifth fin comprises a fifth lower portion and a fifth upper portion, wherein the fifth fin has a fifth strain difference between the fifth lower portion and the fifth upper portion, and wherein the fifth strain difference is the same as the first strain difference.

9. A device, comprising:

a first fin, a second fin, a third fin, and a fourth fin disposed adjacent to a substrate, the first fin being laterally displaced from the second fin by a first isolation region and a first distance, the second fin being laterally displaced from the third fin by a second isolation region and a second distance, the third fin being laterally displaced from the fourth fin by a third isolation region and a third distance, the first distance being greater than each of the second distance and the third distance;

a first insulation layer extending along a sidewall of the first fin, a first top surface of the substrate, and a first sidewall of the second fin, the first insulation layer comprising a minority of the first isolation region;

a second insulation layer extending along a second sidewall of the second fin, a second top surface of the substrate, and a first sidewall of the third fin, the second insulation layer comprising a bulk of the second isolation region;

a third insulation layer extending along a second sidewall of the third fin, a third top surface of the substrate, and a sidewall of the fourth fin, the third insulation layer comprising a bulk of the third isolation region, a compressive strain in a lower portion of the third fin being greater than a compressive strain in an upper portion of the third fin, a compressive strain in a lower portion of the fourth fin being substantially equal to a compressive strain in an upper portion of the fourth fin; and a fourth insulation layer disposed adjacent to the first insulation layer, the third insulation layer being interposed between the first fin and the second fin, the third insulation layer comprising a bulk of the first isolation region.

10. The device of claim 9, wherein a compressive strain in a lower portion of the second fin is greater than a compressive strain in an upper portion of the second fin, and wherein the compressive strain in the lower portion of the second fin is greater than the compressive strain in the lower portion of the third fin.

11. The device of claim 10, wherein a compressive strain in a lower portion of the first fin is greater than a compressive strain in an upper portion of the first fin, and wherein the compressive strain in the lower portion of the first fin is substantially equal to the compressive strain in the lower portion of the second fin.

12. The device of claim 9, wherein the second distance is substantially equal to the third distance.

13. The device of claim 12, further comprising:

a fifth fin disposed adjacent to the substrate, the fifth fin being laterally displaced from the fourth fin by a fourth isolation region and a fourth distance, the fourth distance being substantially equal to the third distance; and a sixth fin disposed adjacent to the substrate, the sixth fin being laterally displaced from the fifth fin by a fifth isolation region and a fifth distance, the fifth distance being substantially equal to the third distance.

14. The device of claim 13, wherein the compressive strain in the lower portion of the third fin is in a direction normal to a major plane of the substrate.

15. A device, comprising:

a first fin disposed adjacent to a substrate, the first fin comprising a first strain difference between a lower portion and an upper portion of the first fin;

a first isolation region disposed adjacent to the first fin;

a second fin disposed adjacent to the first isolation region, the first isolation region being interposed between the first fin and the second fin, the second fin being laterally displaced from the first fin by a first distance, the second fin comprising a second strain difference between a lower portion and an upper portion of the second fin;

a second isolation region disposed adjacent to the second fin; and a third fin disposed adjacent to the second isolation region, the second isolation region being interposed between the second fin and the third fin, the third fin being laterally displaced from the second fin by a second distance, the second distance being less than the first distance, the third fin comprising a third strain difference between a lower portion and an upper portion of the third fin.

16. The device of claim 15, wherein the first strain difference is substantially equal to the second strain difference.

17. The device of claim 16, wherein the first strain difference is between 0.3% and 1.3% of a strain in the upper portion of the first fin.

18. The device of claim 15, wherein the second strain difference is greater than the third strain difference.

19. The device of claim 18, wherein the third strain difference is substantially zero.

20. The device of claim 18, wherein the third strain difference is between 0.3% and 0.6%.

* * * * *